United States Patent
Tan et al.

(10) Patent No.: US 8,176,399 B2
(45) Date of Patent: May 8, 2012

(54) USING SHORT BURST ERROR DETECTOR IN A QUEUE-BASED SYSTEM

(75) Inventors: Weijun Tan, Longmont, CO (US);
Shaohua Yang, San Jose, CA (US);
Hongwei Song, Longmont, CO (US)

(73) Assignee: LSI Corporation, Milpitas, CA (US)

( * ) Notice: Subject to any disclaimer, the term of this patent is extended or adjusted under 35 U.S.C. 154(b) by 650 days.

(21) Appl. No.: 12/380,237

(22) Filed: Feb. 25, 2009

(65) Prior Publication Data

US 2009/0276689 A1    Nov. 5, 2009

Related U.S. Application Data

(63) Continuation-in-part of application No. 12/287,959, filed on Oct. 15, 2008, and a continuation-in-part of application No. 12/114,462, filed on May 2, 2008.

(51) Int. Cl.
*H03M 13/03*      (2006.01)
(52) U.S. Cl. .......................... 714/788; 714/795
(58) Field of Classification Search ............ 714/799, 714/758, 755, 786, 801, 756, 762, 788; 369/53.44; 375/262, 341
See application file for complete search history.

(56) References Cited

U.S. PATENT DOCUMENTS

| | | | | |
|---|---|---|---|---|
| 5,278,846 A * | 1/1994 | Okayama et al. | ............. | 714/755 |
| 5,682,114 A * | 10/1997 | Ohta | ............. | 327/276 |
| 6,772,384 B1 * | 8/2004 | Noguchi | ............. | 714/755 |
| 6,772,386 B2 * | 8/2004 | Iwata et al. | ............. | 714/755 |
| 6,906,654 B2 * | 6/2005 | Walsh et al. | ............. | 341/155 |
| 7,646,829 B2 * | 1/2010 | Ashley et al. | ............. | 375/340 |
| 7,698,619 B1 * | 4/2010 | Liu | ............. | 714/752 |
| 8,046,659 B1 * | 10/2011 | Liu | ............. | 714/752 |
| 2006/0168493 A1 * | 7/2006 | Song | ............. | 714/752 |
| 2010/0211857 A1 * | 8/2010 | Kobayashi | ............. | 714/784 |

* cited by examiner

*Primary Examiner* — Phung M Chung
(74) *Attorney, Agent, or Firm* — Suiter Swantz pc llo

(57) ABSTRACT

A system, method, and device for detecting short burst errors in a queue-based system is disclosed. A first detector performs a data detection on a first input data set at a first time and on a second input data set at a second time. A second detector performs a data re-detection on input data sets. A decoder decodes derivations of the outputs of the first and second detector. A short burst error detector may perform a short burst error detection on decoded data and erase any detected errors. An output data buffer stores and orders the decoded data for output.

19 Claims, 6 Drawing Sheets

USING SHORT BURST ERROR DETECTOR IN A QUEUE-BASED SYSTEM

CROSS-REFERENCE TO RELATED APPLICATIONS

This Application is a continuation-in-part of U.S. patent application Ser. No. 12/287,959 filed Oct. 15, 2008 entitled: A Method for Detecting Short Burst Errors in LDPC System (pending). This Application is a continuation-in-part of U.S. patent application Ser. No. 12/114,462 filed May 2, 2008 entitled: Systems and Methods for Queue Based Data Detection and Decoding (pending). Said application Ser. Nos. 12/287,959 and 12/114,462 are hereby incorporated by reference in their entirety herein.

TECHNICAL FIELD

The present disclosure is related to systems and methods for decoding information, and more particularly to systems and methods for performing codec based short burst error detection and correction in a queue-based iterative decoding system.

BACKGROUND

In data transfer systems, data is transferred from a sender to a receiver via a medium. The effectiveness of a data transfer is impacted by data errors caused by various factors. For example, data read from a disk is susceptible to errors caused by media defects and thermal asperities which may result in burst errors. As data is moved between the storage media and the auxiliary storage device, the data is transmitted over a read channel. Media defects and thermal asperities are transient electrical events, usually associated with a particle, and normally resulting in misreading data in a portion of a sector. Absent accurate detection of these errors the effectiveness of data transmission is reduced. A burst error is a number of errors adjacent to each other. Burst errors happen relatively frequently in the transmission of data and are defined as long or short burst. Long burst errors are easy to detect because of the existence of strong signatures. In order to detect and correct data errors, including long burst errors, a data detection and decoding may be performed. Oftentimes it may be desirable to perform multiple data detection and decoding iterations on a data set in order to enhance the chance of converging on a corrected data set. The number of data detection and decoding iterations may vary depending on the data set.

In contrast, short burst errors are difficult to detect in a data detection and decoding because of lack of signatures. This difficulty in detection of short burst errors is common to all coding practices. For example, the failure to detect the short burst errors using low-density parity-checking encoders and decoders may result in these errors being magnified at the output of the detector and decoder.

SUMMARY

The present disclosures are related to systems and methods for performing codec based short burst error detection and correction in a queue-based decoding system.

A data processing system includes, but is not limited to: a detector, wherein the detector is operable to perform a data detection iteration on an input data set; and a short burst error detector, wherein the short burst error detector is configured for receiving an output from the detector to generate a flag identifying a short burst error in the input data set, wherein the flag is configured to produce a short burst error scaled output from the detector.

A method for processing a data input includes, but is not limited to: utilizing a first detector, a second detector, and a short burst error detector; performing a data detection on an input data set using the first detector, wherein a detected data set is generated; interleaving the detected data set, wherein an interleaved data set is generated; decoding the interleaved data set, wherein an decoded data set is generated; determining whether the decoded data set converged, wherein the decoded data set is output to an output data buffer if the decoded data set converged; providing the decoded data set for subsequent processing using the second detector based at least in part on said determination of convergence; re-detecting the decoded data set using the second detector, wherein a re-detected data set is generated, wherein the steps of interleaving, decoding, determining, providing, and re-detecting may be repeated on the re-detected data set; flagging a short burst error in the re-detected data set using the short burst error detector, wherein the short burst error detector accepts both the soft information of the decoded data set and the soft information of the re-detected data set as inputs; and scaling the flagged short burst error in the re-detected data set, wherein an scaled data set is generated, wherein the steps of interleaving, decoding, determining, providing, and re-detecting may be repeated on the erased data set.

A data processing circuit includes, but is not limited to: a first detector, wherein the first detector is operable to perform a data detection on a first input data set at a first time and on a second input data set at a second time; a second detector; a decoder, wherein the decoder is operable to receive a derivation of an output from the first detector corresponding to the first data set, an output from the first detector corresponding to the second data set, and a derivation of an output from the second detector; wherein the second detector is operable to perform a data detection on the first input data set using the output of the decoder corresponding to the first input data set at a third time only if the output of the decoder failed to converge, and wherein the third time is subsequent to the first time and to the second time; a short burst error detector, wherein the short burst error detector is operable to perform a short burst error detection on a derivation of the output of the decoder and the output of the second detector, wherein the short burst error detector is operable to perform a short burst error detection if at least one of a preset minimum number of data detection iterations have been performed on the first input data set or a number of violated parity check equations performed by the decoder on the first input data set has fallen below a preset threshold; an erasure decoder, wherein the erasure decoder is operable to perform erasure decoding on the output of the second detector, wherein the erasure decoding outputs a scaled version of the soft input of the second detector when a short burst error is detected; and an output data buffer, wherein the output data buffer receives the output of the decoder corresponding to the first input data set subsequent to receiving the output of the decoder corresponding to the second input data set, and wherein the output data buffer is operable to order the first decoder output in relation to the second decoder output.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the present disclosure may be better understood by those skilled in the art by reference to the accompanying figures in which.

DETAILED DESCRIPTION

Figure 1:
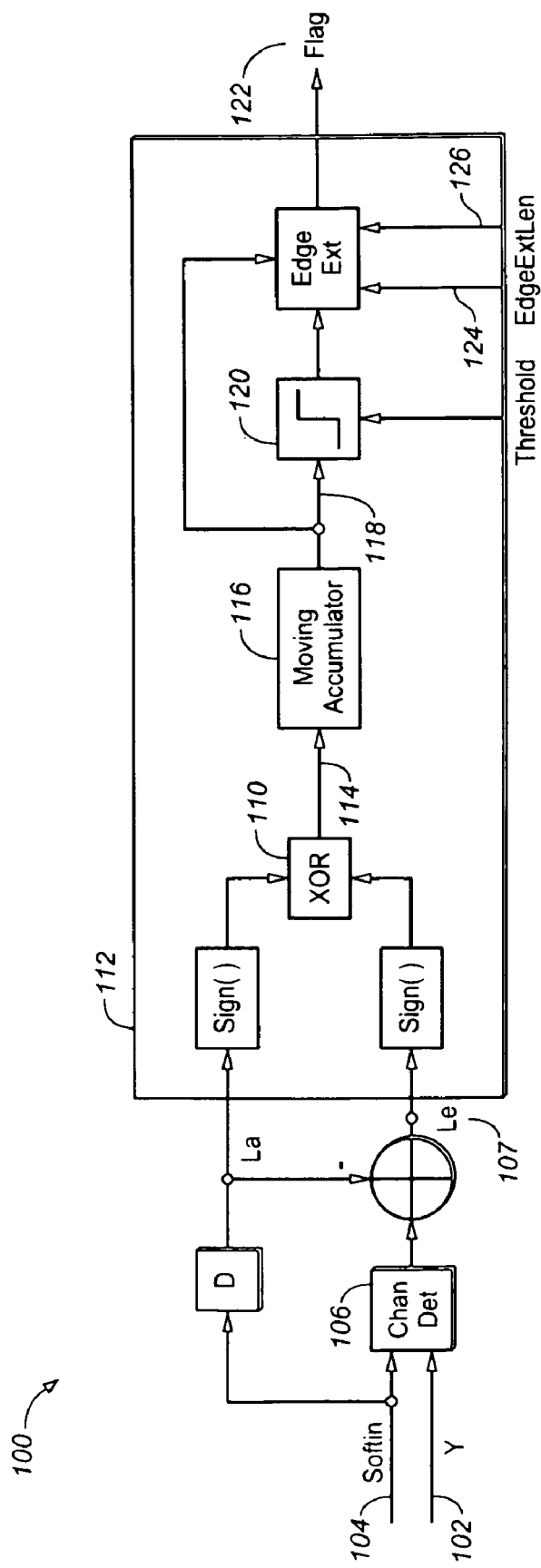
FIG. 1 is a block diagram illustrating a device for detecting and flagging short burst errors.
Figure 2:
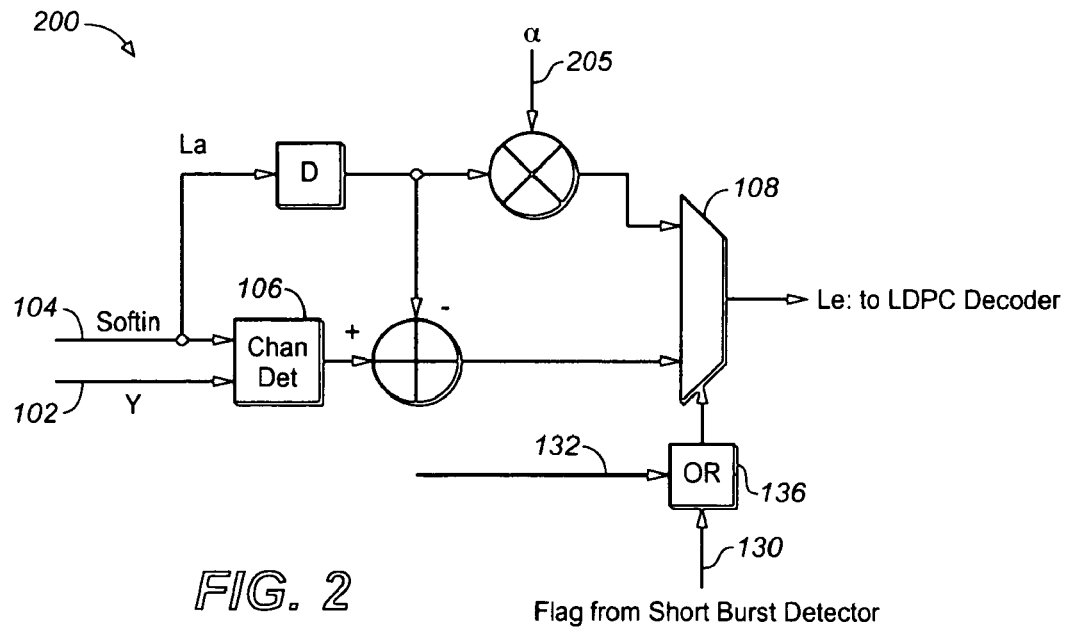
FIG. 2 is a block diagram illustrating a device for performing erasure decoding on short burst errors.
Figure 3:
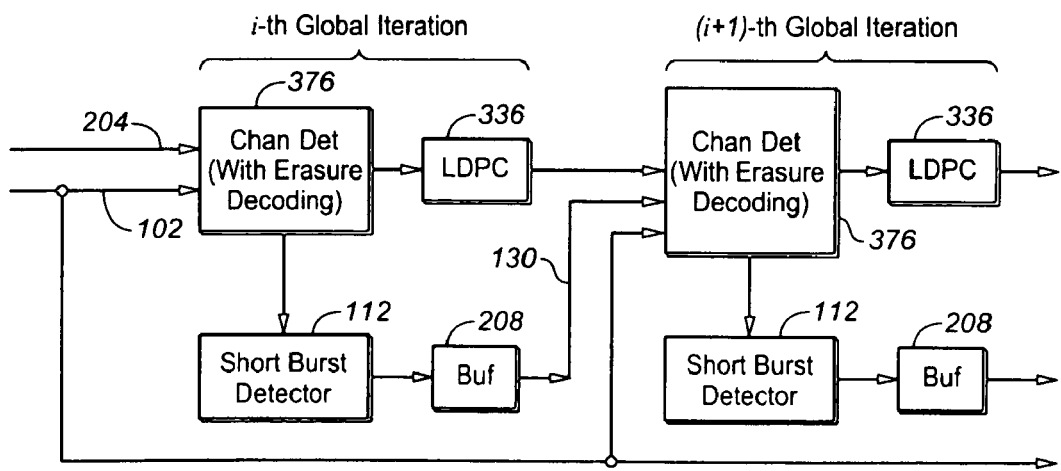
FIG. 3 is a block diagram illustrating the operation of a queue-based data detection and decoding system performing short burst error erasure decoding with a buffered short burst error flag.

Reference will now be made in detail to the presently preferred embodiments of the disclosure, examples of which are illustrated in the accompanying drawings.

Referring generally to FIGS. 1-8, various aspects of implementing a short burst error detection device in a queue-based decoding system in accordance with an exemplary embodiment of the present disclosure is shown. A device 100 may include both a signal input 102 and a soft signal input (La) 104. Signal input 102 may be a waveform. Both signal input 102 and soft signal input 104 may be provided as inputs to channel detector 106. Channel detector 106 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention. The output of channel detector 106 may be soft output (Le) 107 and may be provided as a first input to short burst error detector 112 after soft input 104 is subtracted from the output of channel detector 106. Further, the soft input 104 may be provided as a second input to the short burst error detector 112.

In further embodiments of the present disclosure, short burst error detector 100 may include logic gate 110. Logic gate 110 may be operable for receiving soft input 104 as a first input and the subtracted signal of soft input 104 from the output of channel detector 106 as a second input. Further, logic gate 110 may be an exclusive OR equivalent (XOR) gate. Logic gate 110 may be configured for checking the sign disagreement of the first input to the short burst error detector and the second input to the short burst error detector. Logic gate 110 may be further configured for generating logic output gate signal 114. For example, logic output gate signal 114 may be disagreement $sign(La) \neq sign(Le)$ 114.

In further embodiments of the present disclosure, short burst error detector 112 may include filter 116. Filter 116 may be configured for receiving logic output gate signal 114 from logic gate 110. Further, filter 116 may be configured for generating filter output signal 118. For example, filter 116 may be a moving average window. Filter 116 is configured for receiving logic output gate signal 114 from logic gate 110 and generating filter output signal 118 based on received logic output gate signal 114. Further, filter 118 may be configured for receiving burst threshold signal 120. For example, burst threshold signal 120 may be configured for providing an adjustable burst threshold level. Where the burst threshold is exceeded erasure flag 122 is generated and an edge extension is performed. For example, first edge 124 is extended to the left and second edge 126 is extended to the right of erasure flag 122 by a maximum number of bits until a good bit is found. For example, where a zero in an averaged sign is found to the left and the right the extension may stop.

In a further embodiment of the present disclosure, erasure flag 122 may be used in a circuit for erasure decoding 200. A circuit may be needed to convert erasure flag 122 into bit-stream flag 130. Bit-stream flag 130 or erasure flag 122 may be used as a control input to multiplexer 108 to perform erasure decoding of the subtracted signal of soft input 104 from the output of channel detector 106. For example, where bit-stream flag 130 or erasure flag 122 is set, multiplexer 108 may output a scaled version of soft input 104. The scalar factor 205 ($\alpha$) may be implemented so the scaled version of soft input $104 = \alpha La$, where $\alpha \geq 0$. In a simplified version of a circuit for erasure decoding 200, a zero may be input into the multiplexer 108 so where bit-stream flag 130 or erasure flag 122 is set, multiplexer 108 may output a zero, effectively erasing the soft input data. Further, where bit-stream flag 130 or erasure flag 122 is not set, multiplexer 108 may output the subtracted signal of soft input 104 from the output of channel detector 106. In a further embodiment, other error flags 132 such as a media defect flag or a thermal asperity flag may be combined with bit-stream flag 130 as a control input to multiplexer 108 through use of an OR function with bit-stream flag 130 or erasure flag 122.

In another embodiment of the present disclosure, a queue based system may perform short burst error detection and erasure decoding while performing multiple data detection and decode iterations on a data set in order to enhance the chance of converging on a corrected data set. Erasure flag 122 may be used in such systems. In a further embodiment of the present disclosure, a queue based system that buffers erasure flag 122 is demonstrated. In a global iteration, channel detector with erasure decoding 376 may perform a data detection on signal input 102 using the LDPC output of the previous iteration 204. The output of channel detector with erasure decoding 376 may be received by short burst detector 112. Short burst detector 112 outputs erasure flag 122 that may be placed in buffer 208 for the next global iteration. The output of channel detector with erasure decoding 376 may also be received by data decoder 336. Data decoder 336 may decode the output of channel detector with erasure decoding 376 and may provide the decoded output for the next global iteration. In the next global iteration, channel detector with erasure decoding 376 may perform a data detection on signal input 102 using the decoded output of data decoder 336 and also may perform erasure decoding on the decoded output of data decoder 336 using a regenerated erasure flag 130. Further data detection and decode iterations may continue in the same manner.

Figure 4:
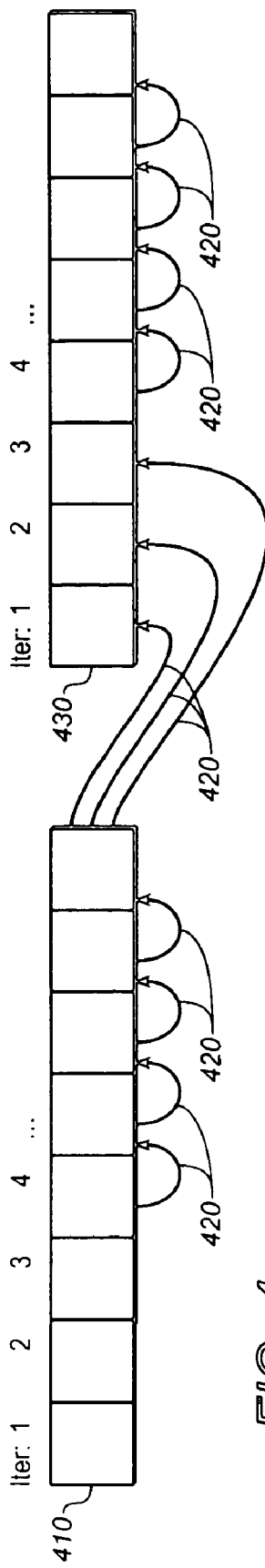
FIG. 4 is a block diagram illustrating the iterative operation of a queue-based data detection and decoding system performing short burst error erasure decoding with a buffered short burst error flag.
Figure 5:
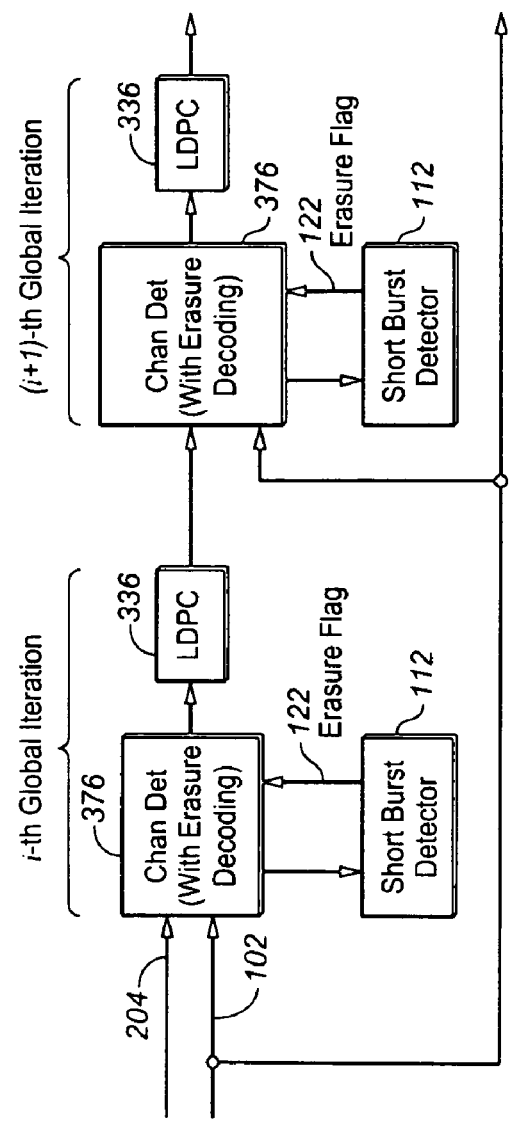
FIG. 5 is a block diagram illustrating the operation of a queue-based data detection and decoding system performing short burst error erasure decoding with a non-buffered short burst error flag.

In FIG. 4, further aspects of a queue based system that buffers erasure flag 122 are demonstrated. In retry 410, each box represents a global data detection and decode iteration. In the fourth iteration of retry 410, short burst error detection begins. Arrows 420 illustrate short burst error detection and erasure, where the arrow tails of arrows 420 indicate when short burst error detection occurs and the arrow heads of arrows 420 indicate erasure occurs during the successive iteration on the corresponding detected short burst errors. In online mode, this is the only pattern of using buffered flags in short burst error detection and erasure. However, in retry mode, after the global data detection and decode iterations have concluded, a second retry 430 may begin. In second retry 420, each box represents a global data detection and decode iteration. Second retry 430 benefits from the short burst error detection of retry 410, and may perform erasure decoding beginning at the first iteration based on the buffered flags of retry 410. This feature may provide for data correction when insufficient global data detection and decode iterations are available in retry 410.

In another embodiment of the present disclosure, a queue based system may perform short burst error detection and erasure decoding while performing multiple data detection and decode iterations on a data set in order to enhance the chance of converging on a corrected data set. Erasure flag 122 may be used in such systems. In a further embodiment of the present disclosure, a queue based system that does not buffer erasure flag 122 is demonstrated. In a global iteration, channel detector with erasure decoding 376 may perform a data detection on signal input 102 using the LDPC output of the previous iteration 204. The output of channel detector with erasure decoding 376 may be received by short burst detector 112. Short burst detector 112 outputs erasure flag 122 that may be received by channel detector with erasure decoding 376. Erasure decoding may then be performed by channel detector with erasure decoding 376. Because channel detector with erasure decoding 376 may wait for short burst detector 112 to output erasure flag 122, a queue based system that does not buffer erasure flag may be delayed. This delay may be variable due to the left edge extension of first edge 124. The output of channel detector with erasure decoding 376 may also be received by data decoder 336. Data decoder 336 may decode the output of channel detector with erasure decoding 376 and may provide the decoded output for the next global iteration. Further data detection and decode iterations may continue in the same manner.

Figure 6:
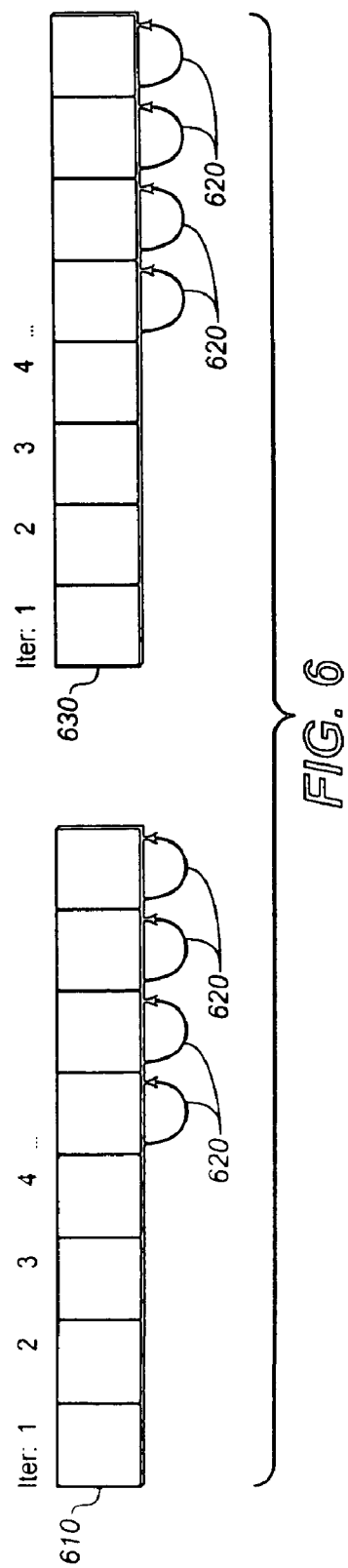
FIG. 6 is a block diagram illustrating the iterative operation of a queue-based data detection and decoding system performing short burst error erasure decoding with a non-buffered short burst error flag.
Figure 7:
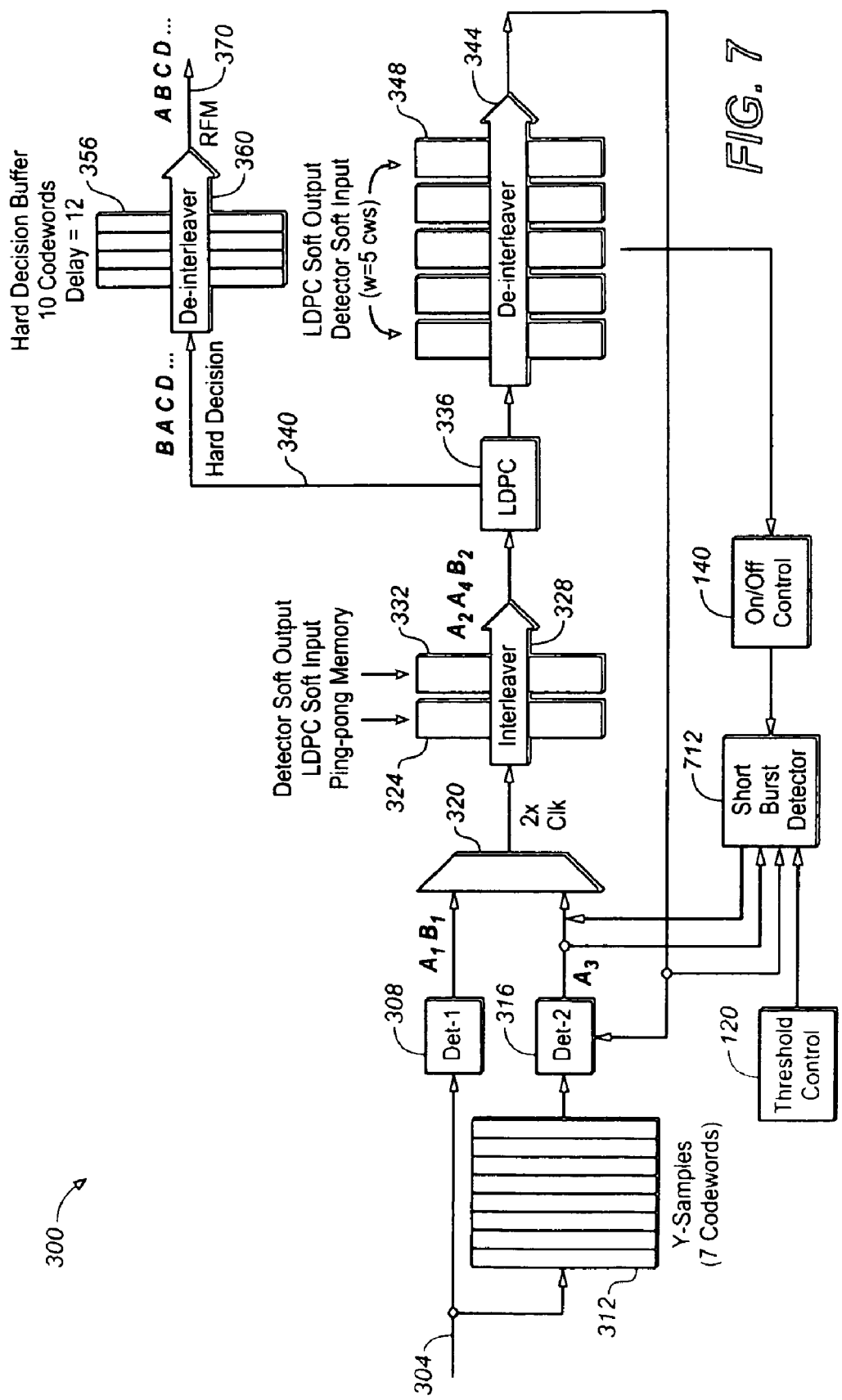
FIG. 7 is a block diagram illustrating a device for detecting short burst errors and performing erasure decoding in a queue-based low-density parity-check (LDPC) system.
Figure 8:
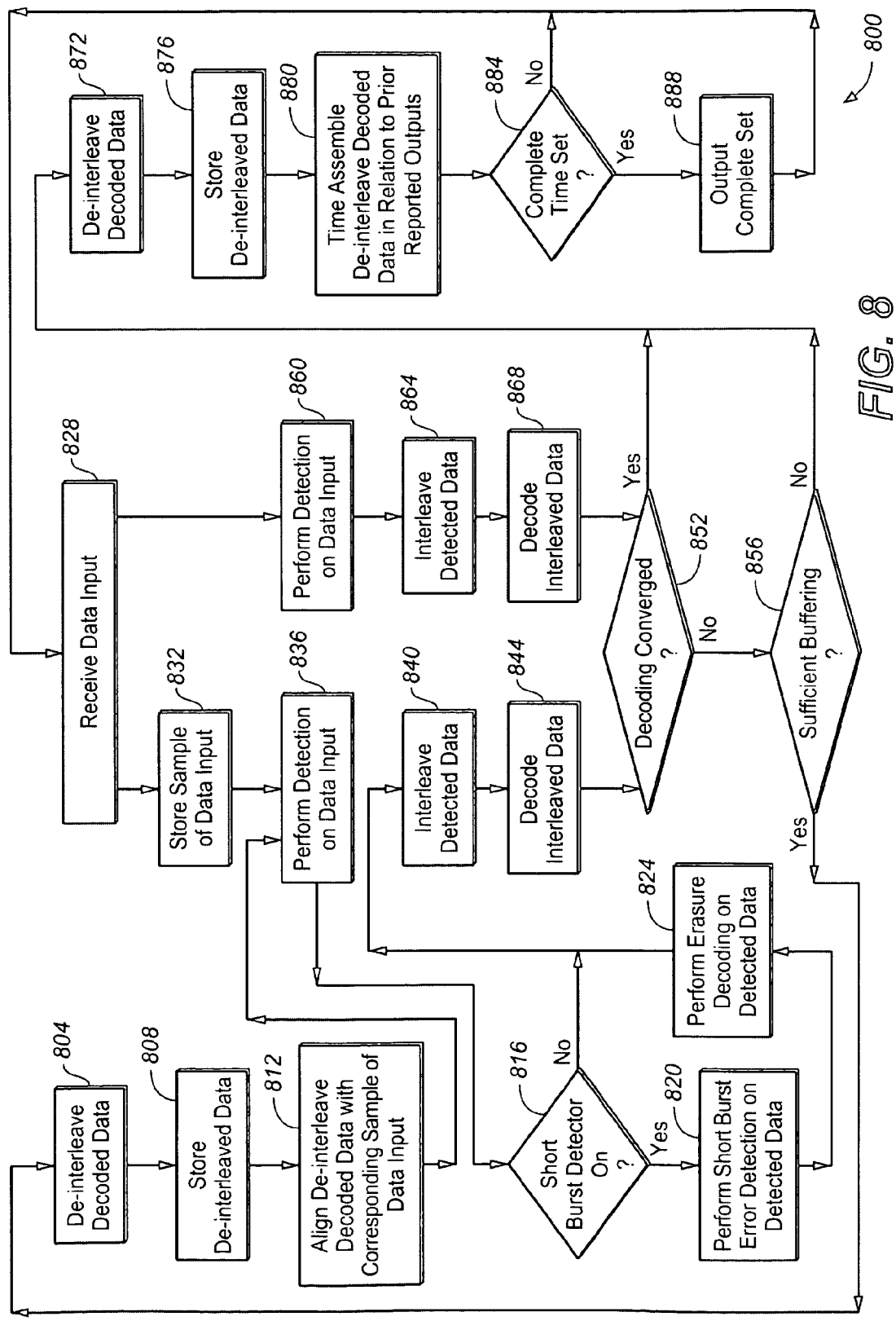
FIG. 8 is a flowchart illustrating a method for detecting short burst errors and performing erasure decoding in a queue-based low-density parity-check (LDPC) system.

In FIG. 6, further aspects of a queue based system that does not buffer erasure flag 122 are demonstrated. In retry 610, each box represents a global data detection and decode iteration. In the fifth iteration of retry 610, short burst error detection begins. Arrows 620 illustrate short burst error detection and erasure decoding, where the arrow tails of arrows 620 indicate when short burst error detection occurs and the arrow heads of arrows 620 indicate erasure decoding occurs during the same iteration on the corresponding detected short burst errors. In online mode, this is the only pattern of using non-buffered flags in short burst error detection and erasure decoding. However, in retry mode, after the global data detection and decode iterations have concluded, a second retry 630 may begin. In second retry 630, each box represents a global data detection and decode iteration. In contrast to a queue based system that uses buffered erasure flags 120, second retry 630 does not benefit from the short burst error detection of retry 610, and may perform erasure decoding beginning at the fifth iteration.

In a further embodiment of the current disclosure, short burst detector with erasure decoding 712 may be implemented in queue-based iterative decoding circuit 300. Queue-based iterative decoding circuit 300 includes data input 304 that is provided to channel detector 308. Channel detector 308 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention. In addition, data input 304 is provided to input data buffer 312 that is designed to hold a number of data sets received from data input 304. The size of input data buffer 312 may be selected to provide sufficient buffering such that a data set input via data input 304 remains available at least until a first iteration processing of that same data set is complete and the processed data is available in ping pong buffer 348 (i.e., a queuing buffer) as more fully described below. Input data buffer 312 provides the data sets to channel detector 316. Similar to channel detector 308, channel detector 316 may be any type of channel detector known in the art including, but not limited to, a SOVA detector or a MAP detector. Again, based on the disclosure provided herein, one of ordinary skill in the art will recognize a variety of channel detectors that may be used in accordance with different embodiments of the present invention.

The output of both channel detector 308 and channel detector 316 are provided to interleaver circuit 328 via multiplexer 320. The output of channel detector 316 may also be provided as an input to short burst detector with erasure decoding 712. Such outputs may be, for example, log likelihood ratio values. Interleaver circuit 328 interleaves the output of channel detector 308 and separately interleaves the output of channel detector 316 using two ping pong buffers 324, 332. One of the buffers in ping pong buffer 324 holds the result of a prior interleaving process of the output from channel detector 308 and is unloaded to LDPC decoder 336, while the other buffer of ping pong buffer 324 holds a data set from channel detector 308 that is currently being interleaved. Similarly, one of the buffers in ping pong buffer 332 holds the result of a prior interleaving process of the output from channel detector 316 and is unloaded to LDPC decoder 336, while the other buffer of ping pong buffer 324 holds a data set from channel detector 316 that is currently being interleaved.

LDPC decoder 336 is capable of decoding one or more data sets simultaneously. As an example, LDPC decoder 336 may be designed to decode an interleaved data set from ping pong buffer 324, or an interleaved data set from ping pong buffer 332, or to decode interleaved data sets from ping pong buffer 324 and ping pong buffer 332 simultaneously. The decoded data is either provided as hard decision output 340 and/or to de-interleaver circuit 344 that uses ping pong buffer 348 to de-interleave the decoded data and to provide the de-interleaved data as an input to channel detector 316 and to short burst detector with erasure decoding 712. One of the buffers in ping pong buffer 348 holds the result of a prior de-interleaving process and is unloaded to channel detector 316 and to short burst detector with erasure decoding 712, while another buffer of ping pong buffer 348 holds a decoded data set currently being de-interleaved. Other ping pong buffers perform the same functions, the number of which may be selected to provide sufficient buffering to allow for short burst error detection of previous data sets. Hard decision output 340 is provided to de-interleaver circuit 356 that de-interleaves hard decision output 340 and stores the de-interleaved result in output data buffer 360. Ultimately, de-interleaver circuit 356 provides the de-interleaved data stored in output data buffer 360 as output 370.

In a further embodiment of the present disclosure, short burst detector with erasure decoding 712 may be configured to accept the de-interleaved data from ping-pong buffer 348 as a first input and the detected data from channel detector 316 as a second input. Short burst detector with erasure decoding 712 may also accept on/off control signal 140 in order to determine whether or not to operate. Short burst detector with erasure decoding 712 may also accept threshold control 120 in order to finely control short burst error detection. When turned off, the output of channel detector 316 is provided to multiplexer 320. When turned on, the short burst detector with erasure decoding 712 may detect short burst errors in the output of channel detector 316 and may provide short burst error erasure decoded output to multiplexer 320. If a short burst error is detected, the short burst error erasure decoded output may be a scaled version of the de-interleaved data from ping-pong buffer 348. If a short burst error is not detected, the short burst error erasure decoded output may be the de-interleaved data from ping-pong buffer 348 subtracted from the output of channel detector 316.

In a further embodiment of the present disclosure, on/off control signal 140 may be configured to turn on short burst error detector 112 for a particular codeword once a preset minimum number of decoding iterations have been performed on that particular codeword. Further, on/off control signal 140 may be configured to turn on short burst error detector 112 for a particular codeword once the violated number of parity check equations is below a preset threshold for that particular codeword in LDPC decoder 336. Further, on/off control signal 140 may be configured to turn on the short burst error detector for a particular codeword for all following iterations once the short burst error detector has been turned on for that particular codeword.

In further embodiments of the present disclosure, burst threshold signal 120 may initially be set large in order to avoid false detection of short burst errors. Burst threshold signal 120 may further be incrementally decreased after each successive iteration to increase the chance of detecting short burst errors. Burst threshold signal 120 may stop being decreased once a pre-set burst threshold minimum is reached. Burst threshold signal 120 may further be repeatedly incrementally decreased only after a series of global data detection and decode iterations has been performed on an input data set.

In operation, first data set is introduced via data input 304 to channel detector 308. Channel detector 308 performs its channel detection algorithm and provides both a hard output and a soft output to multiplexer 320. The hard and soft decision data is written to one buffer of ping pong buffer 324. At the same time the detector output is written into the buffer, interleaver 328 interleaves the data set by writing consecutive data into non-consecutive memory/buffer addresses based on the interleaver algorithm/mapping. Once interleaver 324 completes its interleaving process, the interleaved data is decoded by LDPC decoder 336. Where the data converges, LDPC decoder 336 writes its output as hard decision output 340 to output data buffer 360 and the processing is completed for that particular data set. Alternatively, where the data does not converge, LDPC decoder 336 writes its soft output to ping pong buffer 348. As more fully described below, the scheduling guarantees that there is at least one empty buffer for holding this new set of data, and this strategy assures that each data input is guaranteed the possibility of at least two global iterations (i.e., two passes through a detector and decoder pair).

The data written to ping pong buffer 348 is fed back to channel detector 316 and to short burst detector with erasure decoding 712. Channel detector 316 selects the data set that corresponds to the output in ping pong buffer 348 from input data buffer 312 and performs a subsequent data detection aided by the soft output data generated by LDPC decoder 336 fed back from ping pong buffer 348. By using the previously generated soft data for data maintained in input data buffer 312, channel detector 316 generally performs a subsequent channel detection with heightened accuracy. If on/off control 140 for short burst detector with erasure decoding 712 is on, the output of this subsequent channel detection is passed to short burst detector with erasure decoding 712 for short burst error detection and erasure decoding. The short burst error erasure decoded output of short burst detector with erasure decoding 712 is then passed to interleaver 328 via multiplexer 320. If the on/off control 140 for short burst detector with erasure decoding 712 is off, the output of this subsequent channel detection is passed to interleaver 328 via multiplexer 320. The data is written to one buffer of ping pong buffer 332, and interleaver 328 interleaves the data. The interleaved data is then passed to LDPC decoder 336 where it is decoded a second time. Similar to the first iteration, a decision is made as to whether the data converged or whether there is insufficient space in ping pong buffer 348 to handle the data. Where such is the case, LDPC decoder 336 writes its output as hard decision output 340 to output data buffer 360 and the processing is complete for that particular data set. Alternatively, where the data does not converge and there is sufficient buffer space in ping pong buffer 348 to receive an additional data set, writes its soft output to ping-pong buffer 348 where it is passed back to channel detector 316 for a third pass. Sufficient space is defined in ping pong buffer 348 by having at least reserved space for the data set from the first detector and decoder after the data set from the second detector and decoder is written into the ping pong buffer.

It should be noted that, as an example, a first data set may be applied at data input 304 and that it takes a number of iterations to converge while all subsequent data sets applied at data input 304 converge on the first pass (i.e., on a single iteration). In such a case, the first data set may be processed a number of times (i.e., a number of iterations) that is limited by the amount of memory available in output data buffer 360. Once output data buffer 360 is full or once an ordered set of outputs are available, the most recent hard decision output corresponding to the first data set is provided as a hard decision output and de-interleaver 356 re-orders the outputs putting the first output in the first position. With this done, output data buffer 360 are flushed out as output 370. In some embodiments of the present invention, de-interleaver 356 does not perform a re-ordering function and output data buffer 360 has a very limited size. In such a case, it is conceivable that a data set could be processed a very large number times (i.e., a large number of iterations) only limited by how long a recipient of output 370 is willing to wait for the data. As another example, it is possible that all data applied as data input 304 converges on its first pass. In such a case, channel detector 316, LDPC decoder 336 and/or de-interleaver 344 may be placed in a power saving mode to conserve power. As yet another example, it may be the case that all data sets applied at data input 304 fail to converge on the first pass (i.e., a single iteration). In such a case, all data sets would be iterated twice. It should also be noted that one or more additional channel detectors may be added along with additional space in ping pong buffers 324, 332, 248 that would facilitate more iterations in the situation where a significant number of closely located data sets fail to converge. In such cases, all data sets can be guaranteed to be decoded with number of iterations the same as the number of detectors.

Based on the disclosure provided herein, it will be appreciated that queuing detection/decoding circuit 300 allows for performance of a variable number of detection and decoding iterations depending upon the introduced data. Further, in some cases, considerable power savings may be achieved through use of queuing detection/decoding circuit 300. Further, in some cases, a faster LDPC decoder may be implemented allowing for an increased throughput where substantial first iteration data convergence exists as multiple iterations are not necessarily required. Further, by allowing results of LDPC decoder 336 to be reported out of order, upstream processing does not have to wait for the completion of downstream processing. Re-ordering of the out of order results may be done by queuing detection/decoding circuit 300 or by a downstream recipient of output 370.

Another embodiment of the present disclosure may be a method of performing short burst error detection in variable iterative detection and decoding processes. Following flow diagram 800, a data input is received (block 828). This data input may be, but is not limited to, a series of data bits received from a magnetic recording medium or a series of bits received from a transmission channel. Based on the disclosure provided herein, one of ordinary skill in the art will recognize a variety of sources and formats for the received data input. A sample of the received data is stored in a buffer and retained for later processing (block 832). Data detection processes are performed on the received data (block 860), the detected data is interleaved (block 864), and the interleaved data is decoded (block 868). It is then determined whether the decoding process converged (block 852), and whether there is sufficient buffering available to reprocess the data (block 856).

Where either the decoding process converged (block 852) or there is insufficient buffering available (block 856), the decoded data is de-interleaved (block 872) and stored in a buffer (block 876). The buffer includes various results that may have become available out of order, and as such the various results are reordered in the buffer to represent the order in which the corresponding data input was originally received (block 880). It is then determined if a complete time set is available in the buffer (block 884). A complete time set includes every result corresponding to received inputs over a given period of time. Thus, for example, where the first result is delayed while two later results are reported, the complete time set exists for the three results once the first result is finally available in the buffer. It should be noted that in some embodiments of the present invention that the results are reported out of order to a recipient. In such cases, there is no need to reorder results or to determine whether complete time sets are available. Where a complete time set is available (block 884) or where the results are to be reported as they are received without regard to order, the result(s) are output to a recipient (block 888).

Alternatively, where the decoding process failed to converge (block 852) and there is sufficient buffering available (block 856), the process of detection and decoding is repeated. In particular, the decoded data is de-interleaved (block 804) and the resulting de-interleaved data is stored to a buffer (block 808). Once the data detector is available, the de-interleaved data is aligned with the corresponding sample of the data input (block 812). The de-interleaved data and the corresponding sample data input is provided to the data detector where a subsequent data detection is performed (block 836) on the originally stored sample of data input (block 832) using the soft input developed in the earlier processing of the same data input (blocks 860, 864, 868, 852, 856, 804, 808, 812). It is then determined whether the short burst detector is on (block 816). Where the short burst detector is on, a short burst error detection is performed on the result of the data detection process (block 820) and erasure decoding is performed on the result of the data detection process (block 824). Where the short burst detector is off or erasure decoding has been performed on the result of the data detection process, the result of the data detection process is interleaved (block 840) and the interleaved data is decoded (block 844). At this point, it is determined whether the data detection and decoding process is to be repeated (blocks 804, 808, 812, 836, 840, 844) or whether the result is to be reported (blocks 872, 876, 880, 884, 888).

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present disclosure. The accompanying method claims present elements of the various steps in a sample order, and are not meant to be limited to the specific order or hierarchy presented.

It is believed that the present disclosure and many of its attendant advantages will be understood by the foregoing description. It is also believed that it will be apparent that various changes may be made in the form, construction and arrangement of the components thereof without departing from the disclosed subject matter or without sacrificing all of its material advantages. The form herein before described being merely an explanatory embodiment thereof, it is the intention of the following claims to encompass and include such changes.

What is claimed is:

1. A data processing system, the system comprising:

A first detector, wherein the first detector is configured to perform a data detection iteration on an input data set;

a short burst error detector, wherein the short burst error detector is configured for receiving an output from the first detector to generate a flag identifying a short burst error in the input data set, wherein the flag is configured produce a short burst error scaled output from the first detector;

a second detector, wherein the second detector is configured to perform a second data detection iteration on the input data set;

a decoder, wherein the decoder is configured to receive a derivation of an output from the second detector and a derivation of either an output from the first detector or the short burst error scaled output from the first detector, and wherein the output of the decoder includes both a hard output and a soft output;

a queuing buffer, wherein the queuing buffer stores the soft output of the decoder corresponding to the input data set;

wherein the first detector is configured to perform the first data detection iteration on the input data set using the output of the decoder only if the output of the decoder faired to converge, and wherein the first data detection iteration is subsequent to the second data detection iteration;

wherein the short burst error detector is configured for receiving both the output from the first detector corresponding to the input data set and the output of the decoder corresponding to the input data set via the queuing buffer to generate a flag identifying a short burst error in the input data set; and an output data buffer, wherein the output data buffer stores the hard output whenever the output of the decoder converges.

2. The system of claim 1, further including:

a buffer, wherein the flag is placed in a buffer to scale a soft data of the input data set, where the short burst error has been identified, to provide an input to a data detection iteration subsequent to the data detection iteration.

3. The system of claim 2, wherein the short burst error scaled output is a scaled version of the soft input of the first detector.

4. The system of claim 3, wherein the short burst error detector is further configured for receiving an on/off control signal;

wherein the on/off control signal is configured to turn the short burst error detector on if at least one of a preset minimum number of data detection iterations have been performed on the input data set or a number of violated parity check equations performed by the decoder on the input data set has fallen below a preset threshold.

5. The system of claim 4, wherein the short burst error detector is further configured for receiving a threshold control signal;

wherein the threshold control signal is configured to avoid false short burst error detection by the short burst error detector when set to a large value.

6. The system of claim 5, wherein the input data set is a first input data set, wherein the decoder output is a first decoder output corresponding to the first input data set, wherein the decoder provides a second decoder output corresponding to a second input data set, and wherein the output data buffer is configured to order the first decoder output in relation to the second decoder output.

7. The system of claim 5, further including:

an input data buffer, wherein the input data buffer stores the input data set for at least a period corresponding to the difference between the second data detection iteration and the first data detection iteration, and wherein the input data set is provided to the first detector from the input data buffer.

8. The system of claim 7, wherein the output of the decoder corresponding to the first input data set is written to an output data buffer even though the output of the decoder corresponding to the first input data set failed to converge.

9. The system of claim 7, wherein the first detector is configured to perform a fourth data detection iteration, wherein the fourth data detection iteration is performed on the second input data set using the output of the decoder corresponding to the second input data set only if the output of the decoder failed to converge, and wherein the fourth data detection iteration is subsequent to the third data detection iteration.

10. The system of claim 5, further including:

an interleaver, wherein the interleaver is configured to interleave the output from the second detector and provide the result as the derivation of the output from the second detector, and is further configured to interleave either the output from the first detector or the short burst error erased output from the first detector and provide the result as the derivation of the output from the first detector.

11. The system of claim 5, wherein the input data set is a first input data set, wherein the second detector is configured to perform a third data detection iteration, wherein the third data detection iteration is performed on a second input data set, wherein the decoder is operable to receive a derivation of the output from the second detector corresponding to the second input data set, and wherein the queuing buffer is configured to overwrite the output of the decoder corresponding to the first input data set with an output of the decoder corresponding to the second input data set.

12. A method for processing a data input, the method including:

utilizing a first detector, a second detector, and a short burst error detector;

performing a data detection on an input data set using the first detector, wherein a detected data set is generated;

interleaving the detected data set, wherein an interleaved data set is generated;

decoding the interleaved data set, wherein an decoded data set is generated;

determining whether the decoded data set converged, wherein the decoded data set is output to an output data buffer if the decoded data set converged;

providing the decoded data set for subsequent processing using the second detector based at least in part on said determination of convergence;

re-detecting the decoded data set using the second detector, wherein a re-detected data set is generated, wherein the steps of interleaving, decoding, determining, providing, and re-detecting is repeated on the re-detected data set;

flagging a short burst error in the re-detected data set using the short burst error detector, wherein the short burst error detector accepts both the decoded data set and the re-detected data set as inputs; and performing erasure decoding on the flagged short burst error in the re-detected data set, wherein a scaled data set is generated, wherein the steps of interleaving, decoding, determining, providing, and re-detecting is repeated on the scaled data set.

13. The method of claim 12, wherein the short burst error detector is configured for receiving an on/off control signal, wherein the on/off control signal is configured to turn the short burst error detector on if at least one of a preset minimum number of re-detecting steps have been performed on the input data set or a number of violated parity check equations performed by the decoding step on the input data set has fallen below a preset threshold.

14. The method of claim 13, wherein the short burst error detector is configured for receiving a threshold control signal, wherein the threshold control signal wherein the threshold control signal is configured to avoid false short burst error detection by the short burst error detector when set to a large value.

15. The method of claim 14, wherein providing the decoded data set for subsequent processing using the second detector includes writing the decoded data set to a queuing buffer.

16. The method of claim 15, wherein the queuing buffer will be full upon writing the decoded data set to the queuing buffer, and wherein a decoded data set is output to the output data buffer even though the decoded data set failed to converge.

17. The method of claim 14, wherein the output data buffer is configured to order the prior decoded data set relative to other decoded data sets.

18. The method of claim 14, wherein the data detection is a first data detection, wherein the detected data set is a first detected data set, wherein providing the decoded data set for subsequent processing using the second detector includes de-interleaving the decoded data set to a queuing buffer, and wherein the method further includes:

storing the input data set;
aligning the decoded data set with the stored input data set; and
performing a second data detection on the stored input data set and the de-interleaved data set using the second detector, wherein a re-detected data set is generated.

19. A data processing circuit, the circuit comprising:
a first detector, wherein the first detector is configured to perform a data detection on a first input data set at a first time and on a second input data set at a second time;
a second detector;
a decoder, wherein the decoder is configured to receive a derivation of an output from the first detector corresponding to the first data set, an output from the first detector corresponding to the second data set, and a derivation of an output from the second detector;
wherein the second detector is configured to perform a data detection on the first input data set using the output of the decoder corresponding to the first input data set at a third time only if the output of the decoder failed to converge, and wherein the third time is subsequent to the first time and to the second time;
a short burst error detector, wherein the short burst error detector is configured to perform a short burst error detection on a derivation of the output of the decoder and the output of the second detector, wherein the short burst error detector is configured to perform a short burst error detection if at least one of a preset minimum number of data detection iterations have been performed on the first input data set or a number of violated parity check equations performed by the decoder on the first input data set has fallen below a preset threshold;
an erasure decoder, wherein the erasure decoder is configured to perform erasure decoding on the output of the second detector, wherein the erasure decoding outputs a scaled version of the soft input of the second detector when a short burst error is detected; and
an output data buffer, wherein the output data buffer receives the output of the decoder corresponding to the first input data set subsequent to receiving the output of the decoder corresponding to the second input data set, and wherein the output data buffer is configured to order the first decoder output in relation to the second decoder output.

* * * * *